(12) United States Patent
Song et al.

(10) Patent No.: US 12,046,680 B2
(45) Date of Patent: Jul. 23, 2024

(54) INNER SPACER FORMATION FOR NANOSHEET TRANSISTORS

(71) Applicant: International Business Machines Corporation, Armonk, NY (US)

(72) Inventors: Yi Song, Albany, NY (US); Chi-Chun Liu, Altamont, NY (US); Robin Hsin Kuo Chao, Portland, OR (US); Muthumanickam Sankarapandian, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 17/485,765

(22) Filed: Sep. 27, 2021

(65) Prior Publication Data

US 2023/0114163 A1 Apr. 13, 2023

(51) Int. Cl.
*H01L 29/66* (2006.01)
*H01L 29/423* (2006.01)
*H01L 29/786* (2006.01)

(52) U.S. Cl.
CPC .. *H01L 29/78696* (2013.01); *H01L 29/42392* (2013.01); *H01L 29/66553* (2013.01); *H01L 29/66742* (2013.01); *H01L 29/78618* (2013.01)

(58) Field of Classification Search
CPC ......... H01L 29/78696; H01L 29/42392; H01L 29/66553; H01L 29/66742; H01L 29/78618; H01L 29/42376; H01L 29/775; H01L 29/66439; H01L 29/66545
See application file for complete search history.

(56) References Cited

U.S. PATENT DOCUMENTS

| | | |
|---|---|---|
| 9,842,914 B1 | 12/2017 | Yeung et al. |
| 9,923,055 B1 | 3/2018 | Cheng et al. |
| 10,424,651 B2 | 9/2019 | Cheng et al. |
| 10,586,856 B2 | 3/2020 | Loubet et al. |
| 10,651,291 B2 | 5/2020 | Frougier et al. |
| 10,903,317 B1 | 1/2021 | Frougier et al. |
| 2018/0053837 A1 | 2/2018 | Bi et al. |
| 2023/0080922 A1* | 3/2023 | Yao ................... H01L 29/66636 257/347 |

* cited by examiner

*Primary Examiner* — Elias Ullah
(74) *Attorney, Agent, or Firm* — L. Jeffrey Kelly; Ryan, Mason & Lewis LLP

(57) ABSTRACT

A semiconductor structure comprises a plurality of gate structures alternately stacked with a plurality of channel layers, and a plurality of spacers disposed on lateral sides of the plurality of gate structures. The respective ones of the plurality of spacers comprise a profile having a first portion comprising a first shape and a second portion comprising a second shape, wherein the first shape is different from the second shape.

20 Claims, 13 Drawing Sheets

INNER SPACER FORMATION FOR NANOSHEET TRANSISTORS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming nanosheet transistor structures where inner spacers have a configuration which effectively isolates source/drain regions. As a result, damage to the source/drain regions is prevented during nanosheet removal when forming gate structures.

In one embodiment, a semiconductor structure comprises a plurality of gate structures alternately stacked with a plurality of channel layers, and a plurality of spacers disposed on lateral sides of the plurality of gate structures. The respective ones of the plurality of spacers comprise a profile having a first portion comprising a first shape and a second portion comprising a second shape, wherein the first shape is different from the second shape.

In another embodiment, a method of forming a semiconductor structure comprises forming a plurality of first semiconductor layers alternately stacked with a plurality of second semiconductor layers, and recessing the plurality of first semiconductor layers with respect to the plurality of second semiconductor layers to form a plurality of openings on lateral sides of the plurality of first semiconductor layers. In the method, a plurality of sacrificial layers are deposited in the plurality of openings. Portions of the plurality of sacrificial layers are removed from the plurality of openings. The removal exposes parts of respective ones of the plurality of the first semiconductor layers. The method further comprises removing the parts of the respective ones of the plurality of the first semiconductor layers to enlarge the plurality of openings, and removing remaining portions of the plurality of sacrificial layers from the plurality of enlarged openings. A plurality of spacers are formed on the lateral sides of the plurality of first semiconductor layers in respective ones of the plurality of enlarged openings.

In another embodiment, a nanosheet structure comprises a plurality of first semiconductor layers alternately stacked with a plurality of second semiconductor layers, and a plurality of spacers disposed on lateral sides of first semiconductor layers. Respective ones of the plurality of spacers comprise a profile having a first portion comprising a first shape and a second portion comprising a second shape extending from the first portion, wherein the first shape is different from the second shape.

DETAILED DESCRIPTION

Figure 1:
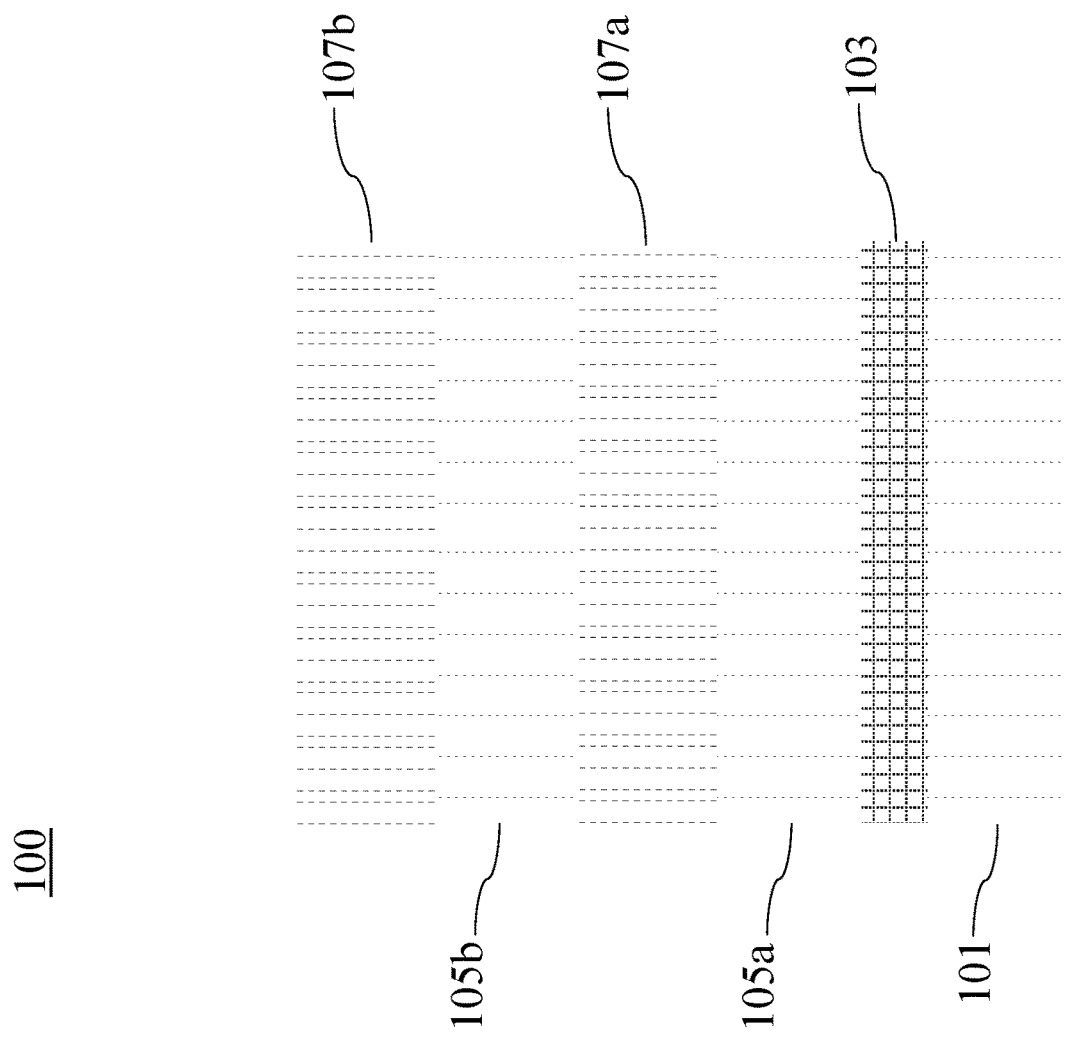
FIG. 1 is a schematic cross-sectional view illustrating formation of a stacked structure of silicon germanium and silicon nanosheet layers, according to an embodiment of the invention.

Illustrative embodiments of the invention may be described herein in the context of illustrative methods for forming nanosheet transistor structures with inner spacer configurations to prevent etchant damage to source/drain regions during nanosheet release, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Nanosheets are relatively thin sheets, for example, with dimensions measured in nanometers (nm). Nanosheets are elliptical or rectangular shaped, or approximately elliptical or rectangular shaped in cross section and have thicknesses or heights such as, for example, less than about 5 nm or 10 nm. The width of a nanosheet may be considerably larger than this height, such as about 20 nm to about 60 nm in the case of a nanosheet which is about 4 nm to about 8 nm in height. The thickness of a nanosheet layer, or height of the rectangle in cross section, affects the electrostatics of the nanosheet.

Nanosheet devices can be viable device options instead of fin field-effect transistors (FinFETs). For example, nanosheets can be used as the fin structure in a dual-gate, tri-gate or gate-all-around (GAA) FET device. CMOS scaling can be enabled by the use of stacked nanosheets, which offer superior electrostatics and higher current density per footprint area than FinFETs. Manufacturing of nanosheet devices may include lateral recessing of certain semiconductor layers in a nanosheet stack, which may be performed by etching. With conventional approaches, the lateral recessing may result in configurations which create a leakage path for an etchant to cause source/drain region damage when removing the certain semiconductor layers in the nanosheet stack.

Illustrative embodiments provide techniques for forming nanosheet transistor structures where recessed portions of silicon germanium (SiGe) layers in a nanosheet stack are formed to have a rectangular profile. As explained in more detail herein, in accordance with one or more embodiments, following a first etching process to laterally recess silicon germanium layers in a nanosheet stack, sacrificial backfill material is deposited in the vacancy created by the first etching process and is used as mask in a second etching process, where additional portions of the silicon germanium layers are selectively removed with respect to the sacrificial backfill material to create an opening having a rectangular profile. The sacrificial backfill material is removed and the opening is filled with inner spacer material, resulting in inner spacers having the rectangular profile. The inner spacers having the rectangular profile prevent an etchant from leaking into and damaging source/drain regions during a silicon germanium layer release process.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

FIG. 1 is a schematic cross-sectional view illustrating formation of a semiconductor device 100 comprising a stacked structure of silicon germanium and silicon nanosheet layers. Referring to FIG. 1, a semiconductor substrate 101 comprises semiconductor material including, but not limited to, silicon (Si), silicon germanium (SiGe), III-V, II-V compound semiconductor or other like semiconductor. In addition, multiple layers of the semiconductor materials can be used as the semiconductor material of the substrate.

In accordance with an embodiment of the present invention, processing may start with a pre-fabricated semiconductor-on-insulator structure comprising the isolation layer 103 pre-formed on the semiconductor substrate 101, and a silicon layer 105a pre-formed on an isolation layer 103. The isolation layer 103 may comprise, for example, silicon oxide ($SiO_x$) (where x is for example, 2, 1.99 or 2.01), silicon oxycarbide (SiOC), silicon oxycarbonitride (SiOCN) or some other dielectric. Alternatively, if a bulk substrate is used, a sacrificial semiconductor layer between the semiconductor substrate 101 and the stacked structure of the silicon layers 105a and 105b and silicon germanium layers 107a and 107b is removed using, for example, an aqueous solution containing ammonium hydroxide ($NH_4OH$) and hydrogen peroxide ($H_2O_2$) or a gas containing hydrogen fluoride (HCl). Following the removal of the sacrificial semiconductor layer, a dielectric layer is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), followed by an etch back to form the isolation layer 103 on the semiconductor substrate 101.

Depending on whether a semiconductor-on-insulator structure or bulk substrate is used, silicon layers 105a and 105b and silicon germanium layers 107a and 107b are epitaxially grown in an alternating and stacked configuration on the sacrificial semiconductor layer, or silicon layer 105b and silicon germanium layers 107a and 107b are epitaxially grown in an alternating and stacked configuration on the silicon layer 105a, which is pre-formed. In either case, a first silicon layer 105a is followed by a first silicon germanium layer 107a on the first silicon layer 105a, which is followed by a second silicon layer 105b on the first silicon germanium layer 107a, and so on. As can be understood, the silicon and silicon germanium layers are epitaxially grown from their corresponding underlying semiconductor layers.

While two silicon layers 105a and 105b and two silicon germanium layers 107a and 107b are shown, the embodiments of the present invention are not necessarily limited to the shown number of silicon layers 105 and silicon germanium layers 107, and there may be more or less layers in the same alternating configuration depending on design constraints. The silicon germanium layers 107a and 107b may be referred to herein as sacrificial semiconductor layers since, as described further herein, the silicon germanium layers 107a and 107b are eventually removed and replaced by gate structures.

Although silicon germanium is described as a sacrificial material for the silicon germanium layers 107a and 107b, and silicon is described as a nanosheet channel material for silicon layers 105a and 105b, other materials can be used. For example, the channel material can be silicon germanium with a germanium percentage of 20% (SiGe20), and the sacrificial semiconductor material can be silicon germanium with a germanium percentage of 60% (SiGe60). Layers 107a and 107b have the property of being able to be removed selectively compared to the nanosheet channel material of layers 105a and 105b.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a rapid thermal chemical vapor deposition (RTCVD), ultra-high vacuum chemical vapor deposition (UHVCVD), or a low pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

In a non-limiting illustrative embodiment, a height of the silicon germanium layers 107a and 107b can be in the range of about 6 nm to about 15 nm depending on the application of the device. In accordance with an embodiment of the present invention, the silicon layers 105a and 105b can include the same or a similar composition to the semiconductor substrate 101. In a non-limiting example, a height of the silicon layers 105a and 105b can be in the range of about 6 nm to about 15 nm depending on the desired process and application. In accordance with an embodiment of the present invention, each of the silicon layers 105a and 105b has the same or substantially the same composition and size as each other, and each of the silicon germanium layers 107a and 107b has the same or substantially the same composition and size as each other.

Figure 2:
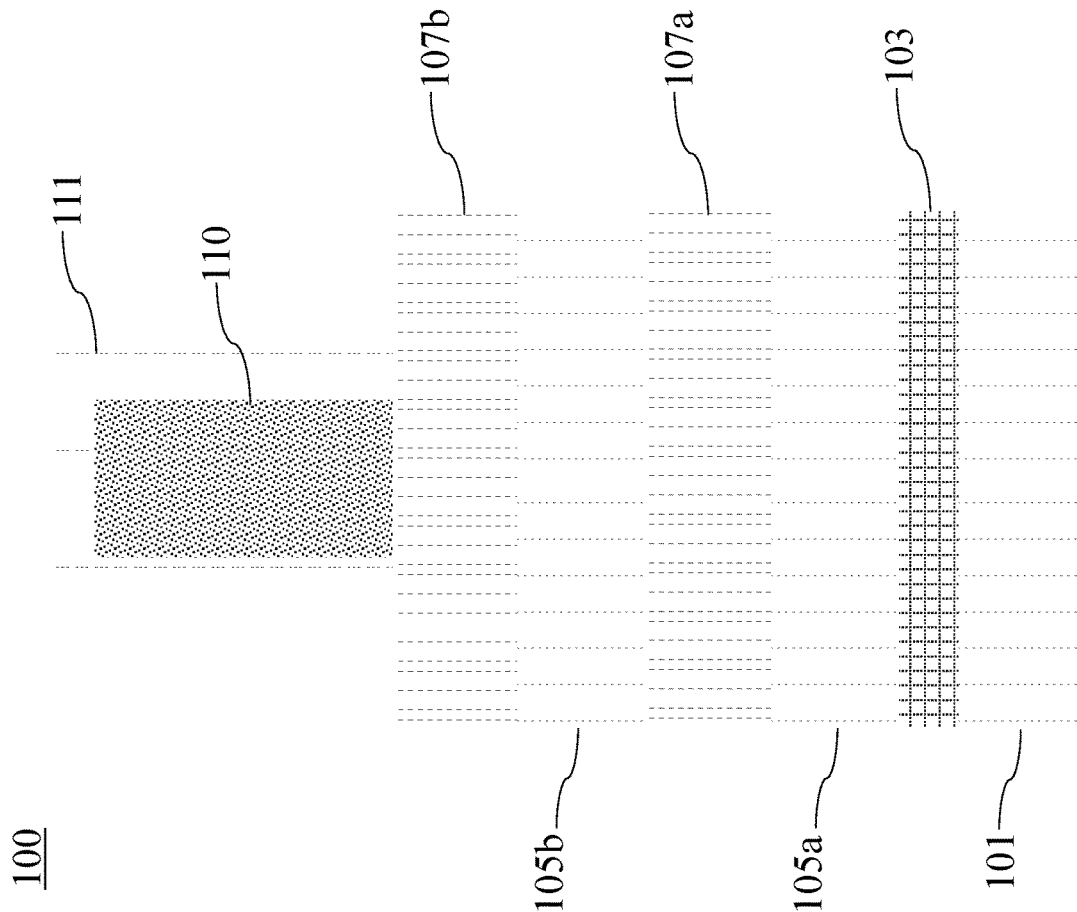
FIG. 2 is a schematic cross-sectional view illustrating formation of a dummy gate structure and dielectric layer on the stacked structure of FIG. 1, according to an embodiment of the invention.

Referring to FIG. 2, a dummy gate structure including a dummy gate portion 110 and a dielectric layer 111 is deposited on the stacked configuration of silicon and silicon germanium layers. The dummy gate portion 110 includes, but is not necessarily limited to, an amorphous silicon (a-Si) layer formed over a thin layer of $SiO_x$. The dummy gate portion 110 is deposited using deposition techniques such as, for example, CVD, PECVD, RFCVD, PVD, ALD, MBD, PLD, LSMCD, sputtering and/or plating, followed by a planarization process, such as, chemical mechanical polishing (CMP), and lithography and etching steps to remove excess gate material, and pattern the deposited layer.

A dielectric layer 111 is formed on top of and on sides of the dummy gate portion 110, and can be formed by one or more of the deposition techniques noted in connection with deposition of the dummy gate material. The dielectric material can comprise for example, one or more dielectrics, including, but not necessarily limited to, silicon nitride (SiN), silicon carbide (SiC), silicon oxynitride (SiON), SiOC, silicon-carbon-nitride (SiCN), boron nitride (BN), silicon boron nitride (SiBN), silicoboron carbonitride (SiBCN), SiOCN, $SiO_x$, and combinations thereof. As described further herein, the dielectric layer 111 functions as a hardmask for part of the processing and spacers are formed from part of the dielectric layer 111. The dielectric layer 111 can be formed by any suitable techniques such as deposition followed by directional etching. Deposition may include but is not limited to, ALD or CVD. Directional etching may include but is not limited to, reactive ion etching (RIE).

For ease of the explanation, one dummy gate portion 110 and dielectric layer 111 is shown. However, the embodiments are not limited thereto, and multiple dummy gate portions and dielectric layers may be formed spaced apart from each other on a stacked structure of silicon and silicon germanium layers.

Figure 3:
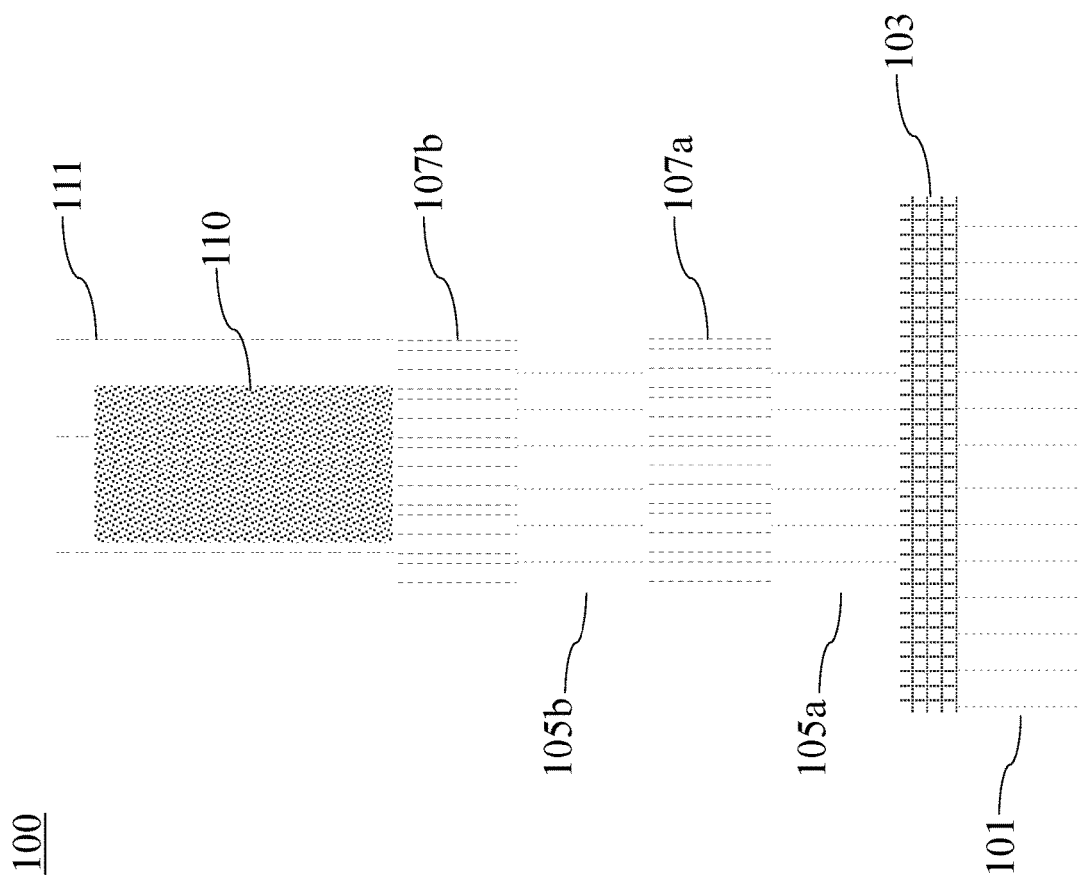
FIG. 3 is a schematic cross-sectional view illustrating patterning of the stacked nanosheet layers of the FIG. 2 structure, according to an embodiment of the invention.

Referring to FIG. 3, exposed portions of the silicon layers 105a and 105b, and silicon germanium layers 107a and 107b, which are not under the dielectric layer 111 or dummy gate portion 110, are removed using, for example, an etching process, such as RIE, where the dielectric layer 111 and dummy gate portion 110 are used as a mask. As can be seen in FIG. 3, the portions of the silicon layers 105a and 105b, and silicon germanium layers 107a and 107b under the dielectric layer 111 and under the dummy gate portion 110 remain after the etching process, and portions of the stacked nanosheets in areas that correspond to where source/drain regions will be formed are removed, exposing a portion of the isolation layer 103 not under the dielectric layer 111 and dummy gate portion 110. As noted above, for ease of explanation, one dummy gate structure and one patterned nanosheet stack are shown. However, the embodiments are not limited thereto, and more than one dummy gate structure and corresponding patterned nanosheet stack can be formed on a semiconductor substrate 101.

Figure 4:
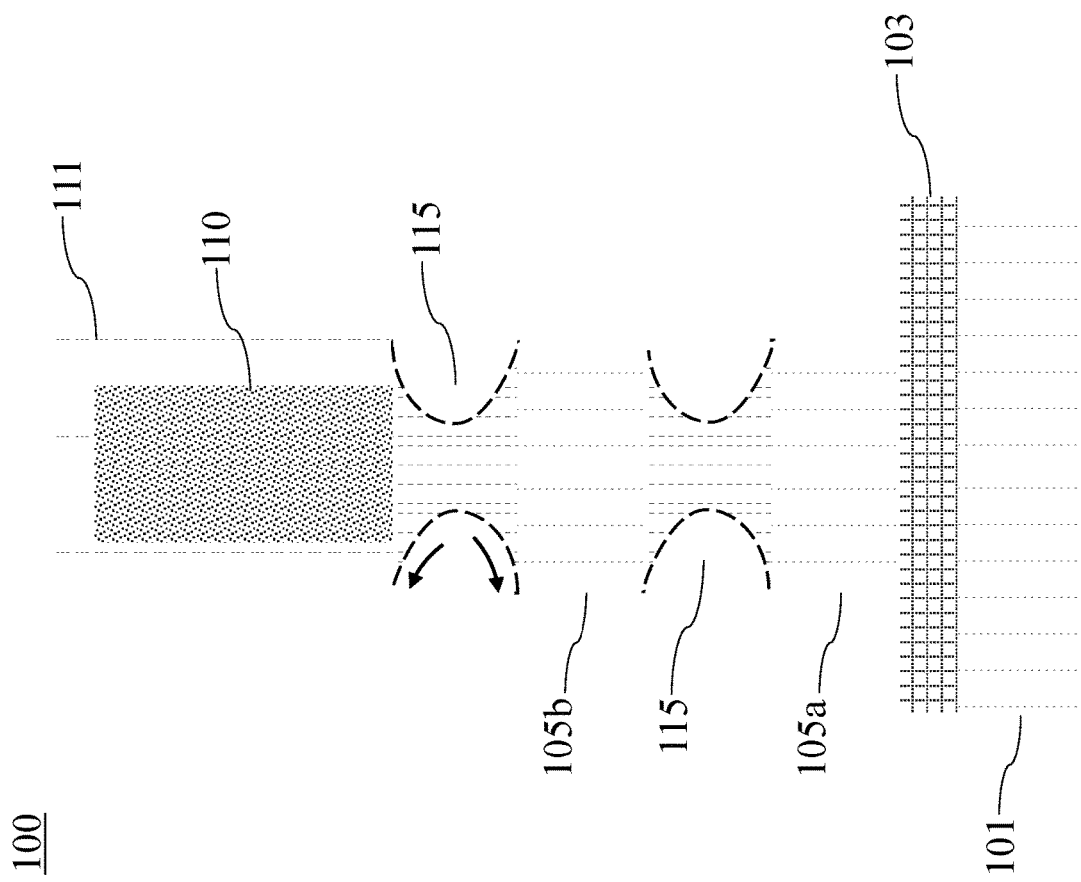
FIG. 4 is a schematic cross-sectional view illustrating lateral recessing of the silicon germanium nanosheet layers of the FIG. 3 structure, according to an embodiment of the invention.

Referring to FIG. 4, due to the germanium in silicon germanium layers 107a and 107b, lateral etching of the silicon germanium layers 107a and 107b can be performed selective to silicon layers 105a and 105b, such that the side portions of the silicon germanium layers 107a and 107b can be removed to create openings 115. As can be seen in FIG. 4, the etching results in semi-circular openings 115 on lateral sides of the remaining portions of the silicon germanium layers 107a and 107b. Referring to the arrows in FIG. 4, due to the curvature of the openings 115, portions of the silicon germanium layers 107a and 107b become narrower with respect to overlying and underlying layers in a direction away from a middle of the silicon germanium layers 107a and 107b. The etching can be performed using, for example, $NH_4OH:H_2O_2$ solution.

Figure 5:
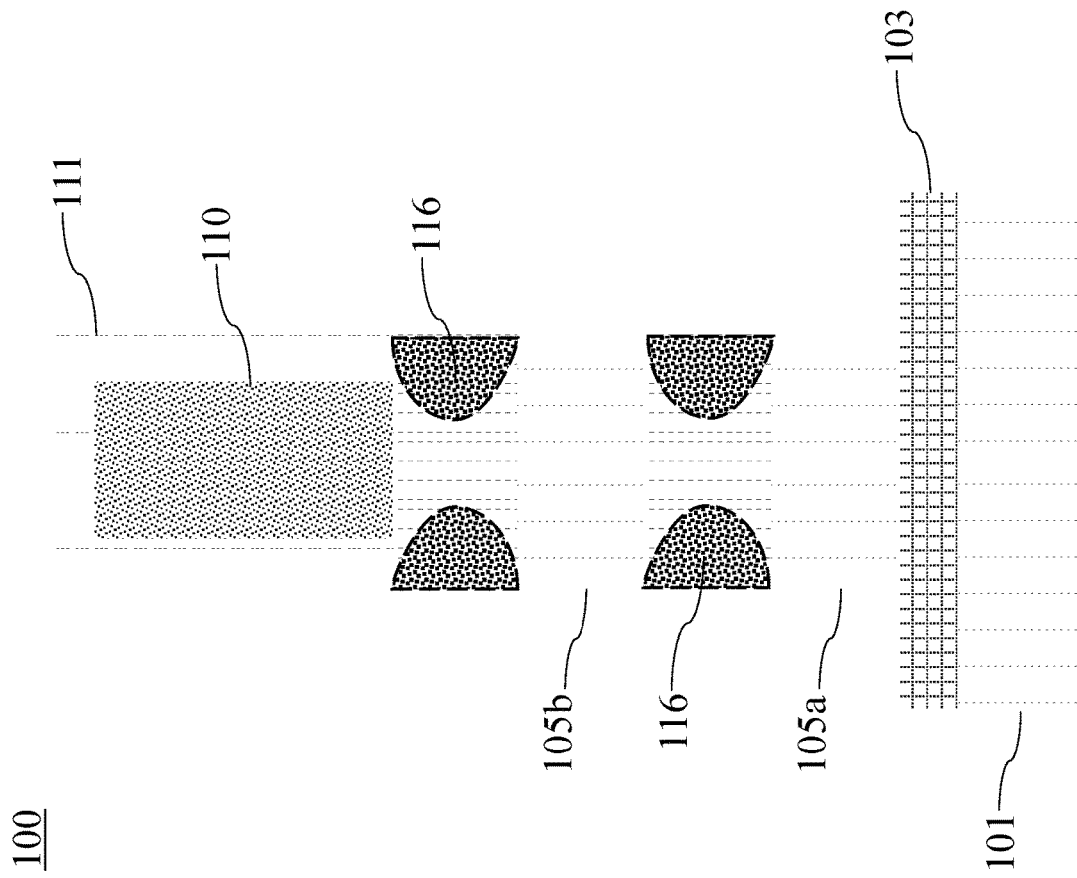
FIG. 5 is a schematic cross-sectional view illustrating backfilling of openings of the FIG. 4 structure formed by the lateral recessing of the silicon germanium nanosheet layers, according to an embodiment of the invention.

Referring to FIG. 5, the openings 115 are backfilled with a sacrificial material 116. In one embodiment, the sacrificial material 116 comprises a conformal oxide (e.g., conformally deposited oxide) deposited by plasma-enhanced atomic layer deposition (PEALD) or ALD. A non-limiting example of a conformal oxide includes silicon oxide. Portions of the sacrificial material 116 are removed from horizontal surfaces, including from the top of dielectric layer 111 on the dummy gate portion 110 and the nanosheet stack and from the isolation layer 103. In addition, portions of the sacrificial material 116 on sides of the nanosheet stack and on sides of the dielectric layer 111 are also removed, leaving the sacrificial material 116 adjacent the remaining portions of the silicon germanium layers 107a and 107b, and filling in the openings 115.

In another embodiment, the sacrificial material 116 comprises polymer brush material. In the case of polymer brush material, deposition of the sacrificial material 116 can be performed using, for example, a spin-on, baking and rinsing technique. The polymer brush material is functionalized at the end of the polymer chain, which can undergo a binding reaction with the surface it contacts with (also referred to as "grafting"). During the baking step, a monolayer of the polymer brush is grafted conformally over the structure. The subsequent rinsing step, which removes the excess unbounded polymers, results in a uniform and conformal layer that is very similar to the silicon oxide layer formed by the ALD or PEALD process described above. A polymer etch process can remove undesired brushes from top and side of the structure and only leave the opening filled with the polymers.

Figure 6:
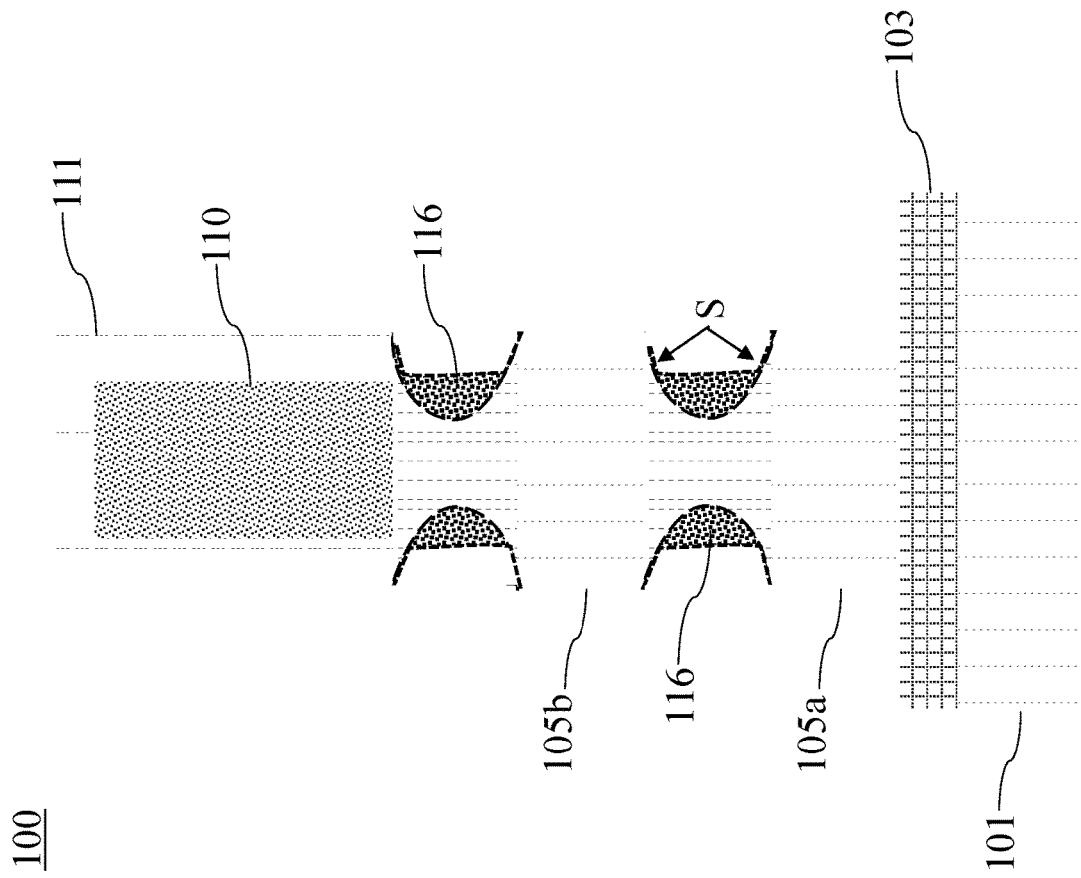
FIG. 6 is a schematic cross-sectional view illustrating partial removal of sacrificial material used for the backfilling from the FIG. 5 structure, according to an embodiment of the invention.

Referring to FIG. 6, portions of the sacrificial material 116 are removed from the openings 115. According to an embodiment, in the case of the conformal oxide deposited by ALD or PEALD, outer portions of the layer of sacrificial material 116 in the openings 115 are removed using diluted hydrofluoric acid (dHF) or a chemical oxide removal (COR) process to leave remaining portions of the layer of sacrificial material 116 in the openings 115. The wet (dHF) or dry (COR) etch back processes selectively remove the sacrificial material 116 with respect to the silicon layers 105a and 105b, and the silicon germanium layers 107a.

According to an embodiment, in the case of polymer brush material, outer portions of the layer of sacrificial material 116 in the openings 115 are removed using oxygen plasma to leave remaining portions of the layer of sacrificial material 116 in the openings 115. The oxygen plasma selectively removes the sacrificial material 116 with respect to the silicon layers 105a and 105b, and the silicon germanium layers 107a. As can be seen in FIG. 6, the removal of the outer portions of the layer of sacrificial material 116 exposes portions S of the silicon germanium layers 107a and 107b at top and bottom portions of the openings 115.

Figure 7:
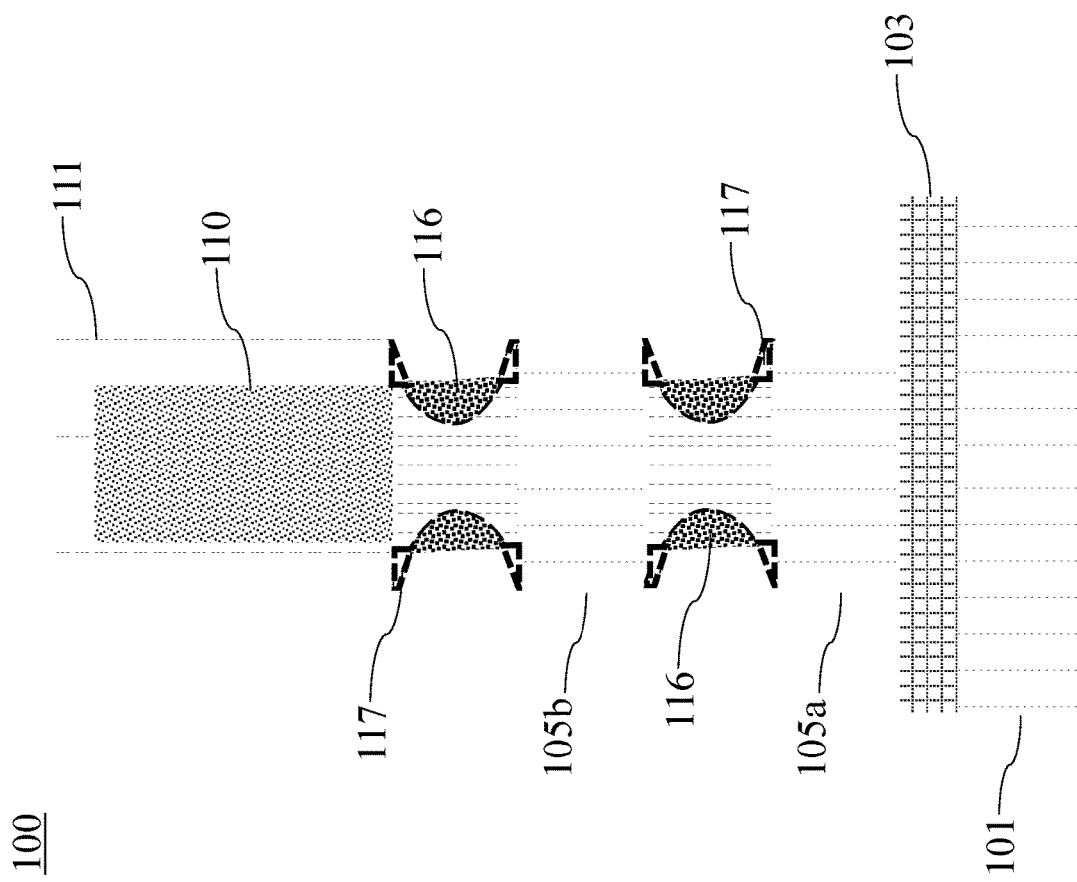
FIG. 7 is a schematic cross-sectional view illustrating selective etching of portions of the silicon germanium nanosheet layers of the FIG. 6 structure, according to an embodiment of the invention.

Referring to FIG. 7, as shown by the dotted triangular portions 117, the exposed portions S of the silicon germanium layers 107a and 107b referenced in FIG. 6, are selectively removed with respect to the sacrificial material 116 and with respect to the silicon layers 105a and 105b. The selective removal is performed using, for example, hot/warm SC1 ($NH_4OH:H_2O_2:H_2O$), which selectively removes the silicon germanium with respect to the sacrificial material at a rate of about 7:1. In a non-limiting embodiment, the volume ratios of deionized water:ammonium hydroxide:hydrogen peroxide in an SC1 solution can be 100:1:1.5, and "hot/warm" can refer to a temperature range of about 40 degrees Celsius to about 65 degrees Celsius. In a non-limiting example, the etch rate of silicon germanium with 25% germanium (SiGe25) is 35 angstroms/minute, while the etch rate of the conformal oxide deposited by ALD or PEALD is 5 angstroms/minute. As can be seen in FIG. 7, the etching of the additional portions of the silicon germanium layers 107a and 107b, exposed by the removal of the outer portions of the sacrificial material 116, enlarges the openings 115. As described further herein in connection with FIG. 8, as a result of the etching of the additional portions of the silicon germanium layers 107a and 107b, a profile of the outer portion of the enlarged opening 115' has a rectangular shape. As used herein, the term "rectangular" is to be broadly construed to include a rectangular shape with perpendicular sides or approximately a rectangular shape (e.g., rectangular-like) where, for example, sides may not be exactly perpendicular (e.g., +5 degrees) due to, for example, semiconductor process constraints.

Figure 8:
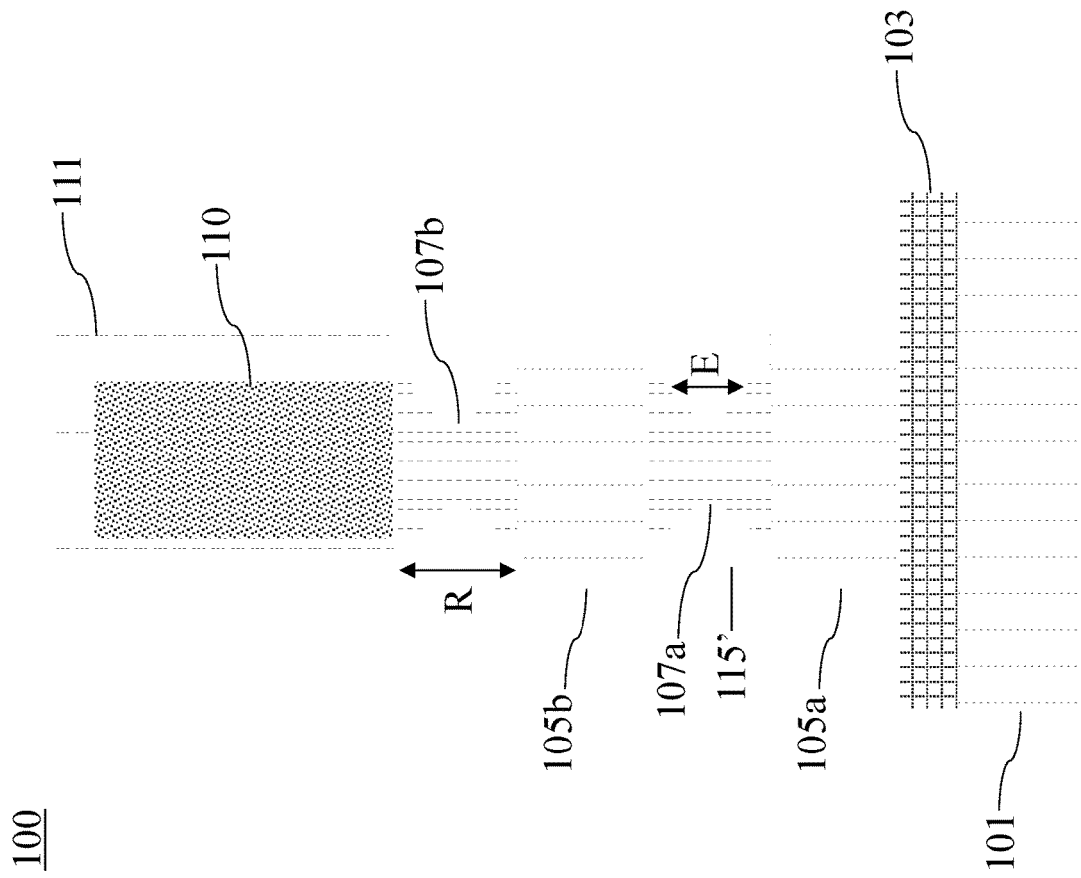
FIG. 8 is a schematic cross-sectional view illustrating removal of remaining portions of the sacrificial material used for the backfilling from the FIG. 7 structure, according to an embodiment of the invention.

Referring to FIG. 8, following the etching of the additional portions of the silicon germanium layers 107a and 107b, the remaining sacrificial material 116 is removed from the enlarged openings 115'. Similar to the processing described in connection with FIG. 6, the selective removal of the remaining portions of sacrificial material 116 is performed using wet (dHF) or dry (COR) etch back processes in the case of the conformal oxide deposited by ALD or PEALD, or using an oxygen plasma process in the case of polymer brush material. As can be seen in FIG. 8, the enlarged opening 115' has a profile comprising a rectangular portion R and an elliptical portion E. The elliptical portion E is adjacent the rectangular portion R. As used herein, the term "elliptical" is to be broadly construed to include an elliptical shape or a part of an elliptical such as, for example, an ellipse, a circle, part of an ellipse or part of a circle, or approximately an elliptical shape where, for example, curves may not be true due to, for example, semiconductor process constraints.

At upper and lower parts of the rectangular portions, respective vertical surfaces of the remaining portions of the silicon germanium layers 107a and 107b are perpendicular or substantially perpendicular to top or bottom surfaces of underlying or overlying silicon layers 105a and 105b or of the dielectric layer 111. As can be seen, respective sides of the remaining portions of the silicon germanium layers 107a and 107b comprise a curved surface between a top linear (e.g., straight) vertical surface and a bottom linear (e.g., straight) vertical surface. A width of respective ones of the remaining portions of the silicon germanium layers 107a and 107b is narrower at a middle portion than at upper and lower portions, and is formed in an hourglass shape.

Figure 9:
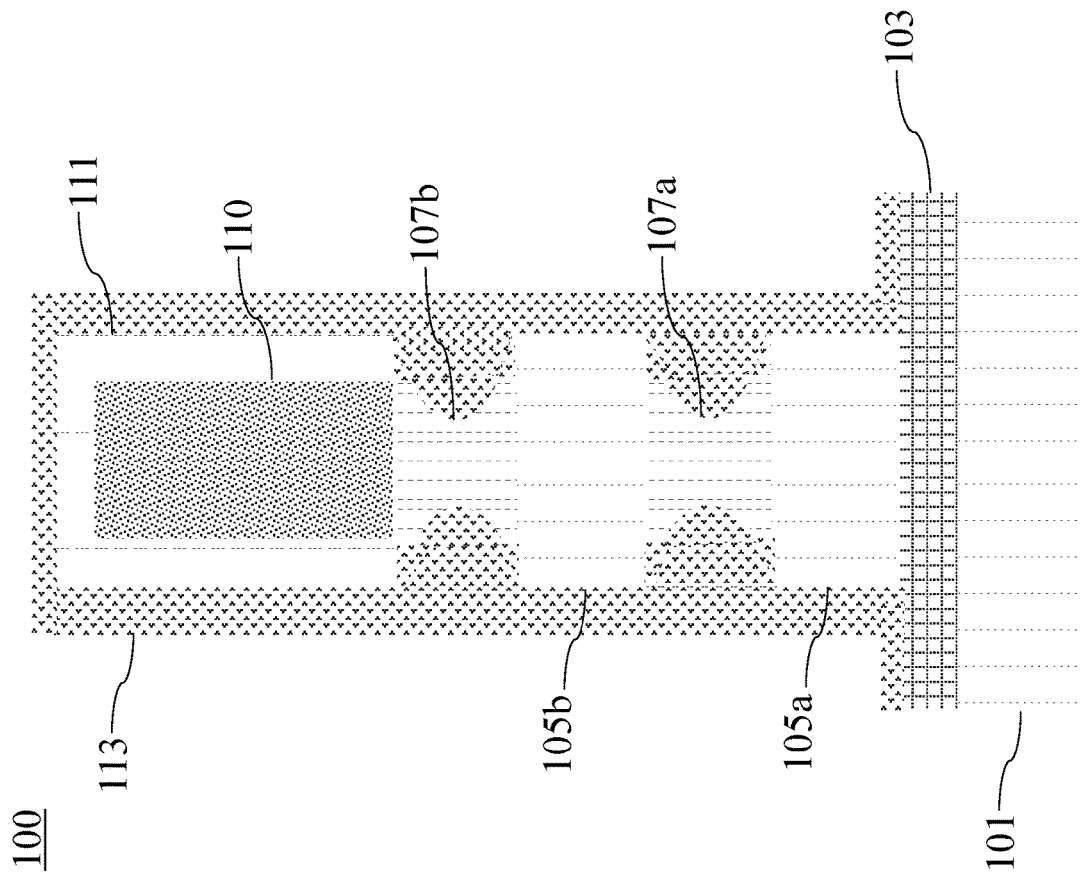
FIG. 9 is a schematic cross-sectional view illustrating conformal deposition of an inner spacer material, according to an embodiment of the invention.

Referring to FIG. 9, inner spacer material 113 is conformally deposited on the structure of FIG. 8 using a deposition technique such as, for example, ALD or CVD. As can be seen, the layer of inner spacer material 113 is deposited on exposed top and side portions of the dielectric layer 111, on an exposed portion of the top surfaces of the isolation layer 103, and on exposed portions of the silicon layers 105a and 105b, and silicon germanium layers 107a and 107b. The inner spacer material 113 is formed in the enlarged openings 115' on lateral sides of the silicon germanium layers 107a and 107b and fills in the enlarged openings 115'. In accordance with an embodiment, the inner spacer material 113 can comprise a dielectric including, but not necessarily limited to, an oxide, such as $SiO_x$, $TiO_x$, $AlO_x$, etc. or a nitride, such as SiN, SiBCN, etc.

Figure 10:
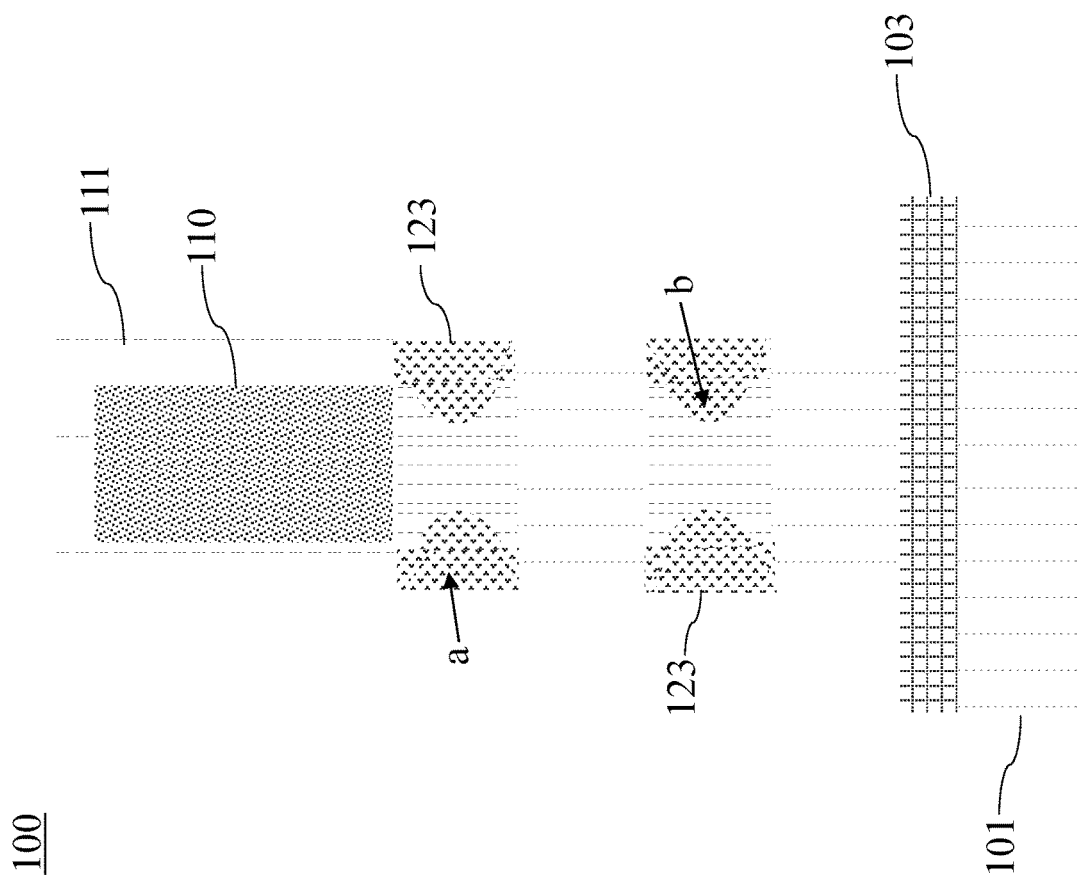
FIG. 10 is a schematic cross-sectional view illustrating removal of portions of the inner spacer material from the structure of FIG. 9 to form inner spacers, according to an embodiment of the invention.

Referring to FIG. 10, portions of the inner spacer material 113 are removed to form inner spacers 123. According to an embodiment, an isotropic etch back process or anisotropic RIE process is performed to remove portions of the inner spacer material 113 from top and sides of the dielectric layer 111, from the top surface of the isolation layer 103, and from side portions of the silicon layers 105a and 105b. In addition, outer portions of the inner spacer material 113 on the lateral sides of the silicon germanium layers 107a and 107b on top of and below the silicon layers 105a and 105b are removed, resulting in the inner spacers 123. According to an embodiment, the isotropic etchback process is performed using, for example, dHF. The etch back process selectively removes the inner spacer material 113 with respect to the dielectric layer 111, the isolation layer 103 and the silicon layers 105a and 105b.

As can be seen in FIG. 10, the inner spacers 123 each have a profile which includes a rectangular portion a and an elliptical portion b, corresponding to that of the enlarged opening 115', comprising the elliptical portion E and the rectangular portion R. The elliptical portions b of the respective ones of the inner spacers 123 are formed on the curved surfaces of respective sides of the silicon germanium layers 107a and 107b. The elliptical portion b of a given one of the inner spacers 123 extends from the rectangular portion a of the given one of the inner spacers 123 toward a lateral side of a corresponding silicon germanium layer 107a or 107b. Each of the inner spacers 123 comprises a curved surface between an upper vertical linear (e.g., straight) surface and a lower vertical linear (e.g., straight) surface. The curved surfaces correspond to the elliptical portions b and the vertical linear surfaces correspond to the rectangular portions a of the inner spacers 123. Each combination of the curved surface and the vertical linear surfaces of the respective ones of the inner spacers 123 are disposed on a corresponding silicon germanium layer 107a or 107b.

Figure 11:
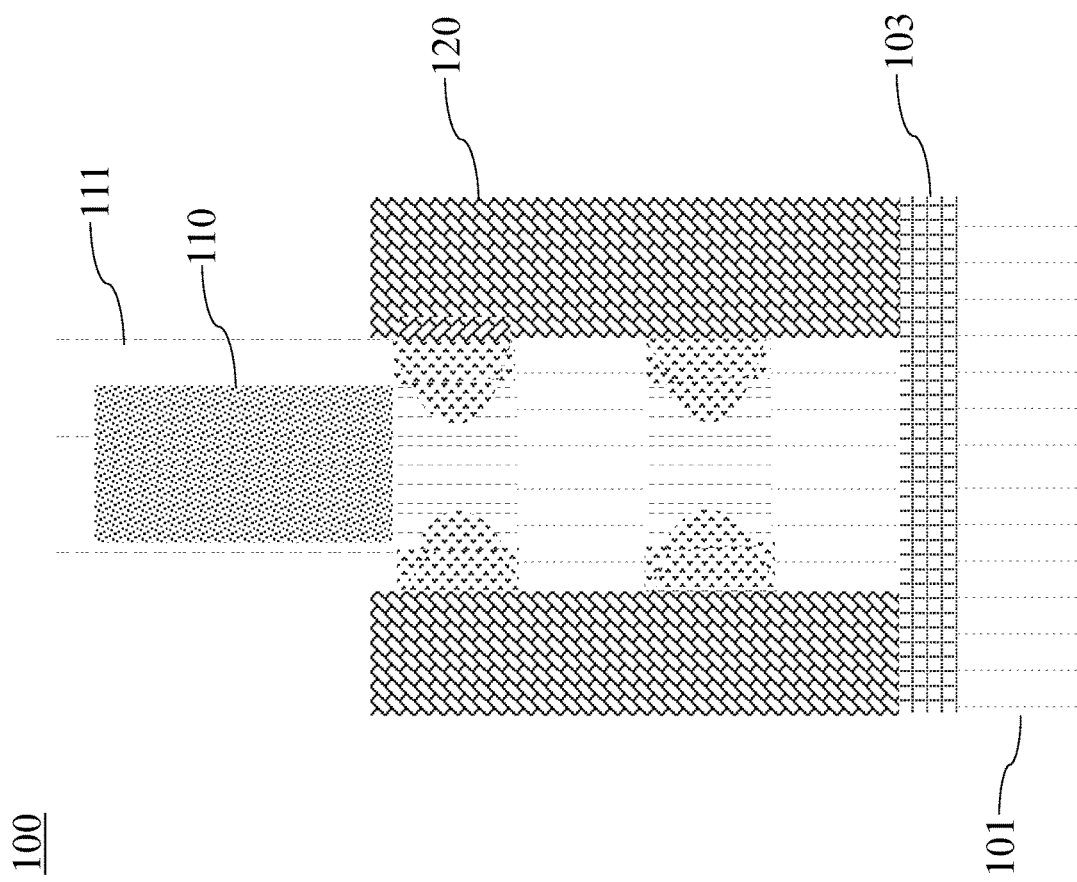
FIG. 11 is a schematic cross-sectional view illustrating epitaxial growth of source/drain regions on the FIG. 10 structure, according to an embodiment of the invention.

Referring to FIG. 11, epitaxial source/drain regions 120 are grown from exposed sides of the silicon layers 105a and 105b of the nanosheet stacks. Side portions of the silicon germanium layers 107a and 107b are covered with the inner spacers 123 during epitaxial growth of epitaxial source/drain regions 120 and source/drain junction formation between silicon layers 105a and 105b (e.g., channel regions) and the epitaxial source/drain regions 120. Due to the inner spacers 123 covering the silicon germanium layers 107a and 107b, lateral epitaxial growth does not occur from the silicon germanium layers 107a and 107b.

According to a non-limiting embodiment of the present invention, the conditions of the epitaxial growth process for the epitaxial source/drain regions 120 are, for example, RTCVD epitaxial growth using $SiH_4$, $SiH_2Cl_2$, $GeH_4$, $CH_3SiH_3$, $B_2H_6$, $PF_3$, and/or $H_2$ gases with temperature and pressure ranges of about 450° ° C. to about 800° C., and about 5 Torr-about 300 Torr. While embodiments of the present invention are described in connection with source/drain regions for a p-type FET (PFET) comprising, for example, silicon germanium source/drain regions, the embodiments are not necessarily limited thereto. The embodiments can also be used in connection with the formation of source/drain regions for n-type FETs (nFETs) comprising, for example, silicon source/drain regions.

After further processing, the epitaxial source/drain regions 120 become the source/drain regions for transistor devices, such as, for example, nFETs or pFETs, and can comprise in-situ phosphorous doped (ISPD) silicon or Si:C for n-type devices, or in-situ boron doped (ISBD) silicon germanium for p-type devices, at concentrations of about $1 \times 10^{19}/cm^3$ to about $3 \times 10^{21}/cm^3$. By "in-situ," it is meant that the dopant that dictates the conductivity type of the doped layer is introduced during the process step, e.g., epitaxial deposition, which forms the doped layer.

Figure 12:
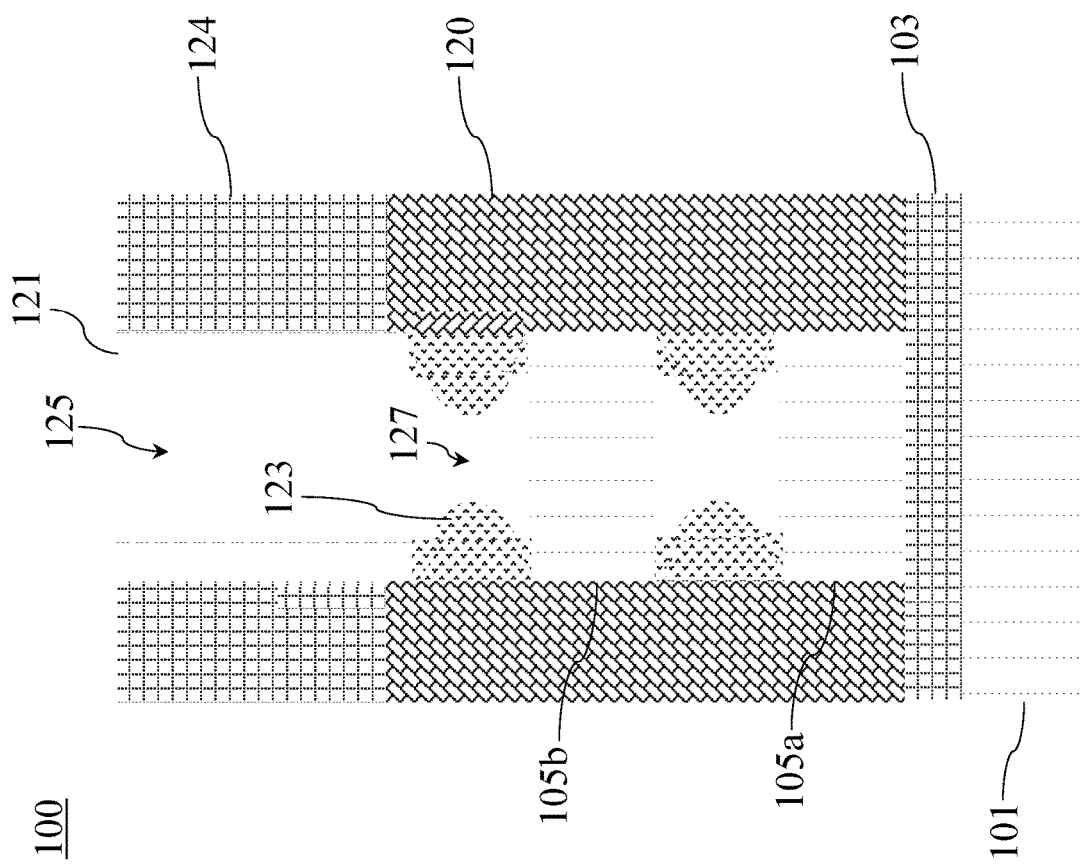
FIG. 12 is a schematic cross-sectional view illustrating inter-layer dielectric (ILD) formation on and dummy gate and silicon germanium nanosheet layer removal from the FIG. 11 structure, according to an embodiment of the invention.

Referring to FIG. 12, the dummy gate portion 110 is selectively removed to create a vacant area 125 where a gate structure including, for example, gate and dielectric portions, will be formed in place of the dummy gate portion 110. The selective removal can be performed using, for example hot ammonia to remove a-Si, and dHF to remove the $SiO_x$. Prior to removal of the dummy gate portion 110, an inter-layer dielectric (ILD) layer 124 is formed on exposed portions of the epitaxial source/drain regions 120, and on sides of the remaining dielectric layer 111, which will function as spacers 121 for a resulting gate structure 130. The ILD layer 124 is deposited using deposition techniques such as, for example, CVD, PECVD, RFCVD, PVD, ALD, MBD, PLD, and/or LSMCD, followed by a planarization process, such as, CMP to remove excess portions of the ILD layer 124 deposited on top of the dummy gate portion 110 and the remaining spacers 121 of the dielectric layer 111. The ILD layer 124 may comprise, for example, $SiO_x$, SiOC, SiOCN or some other dielectric.

The silicon germanium layers 107a and 107b are selectively removed to create vacant areas 127 where a gate structure will be formed in place of the silicon germanium layers 107a and 107b. The layers silicon germanium 107a and 107b are selectively removed with respect to the silicon layers 105a and 105b, and the spacers 121 and 123. The selective removal can be performed using, for example, a dry HCl etch. Due to the formation of the enlarged openings 115' comprising the rectangular profile, the structure of the inner spacers 123 including the profile having the rectangular and elliptical portions protects the epitaxial source/drain regions 120 from being etched during removal of the silicon germanium layers 107a and 107b. The combined configuration of the rectangular and elliptical portions of the inner spacers 123 blocks the etchant for removing the silicon germanium layers 107a and 107b from reaching the epitaxial source/drain regions 120, which, in the case of a PFET, may also comprise silicon germanium.

Figure 13:
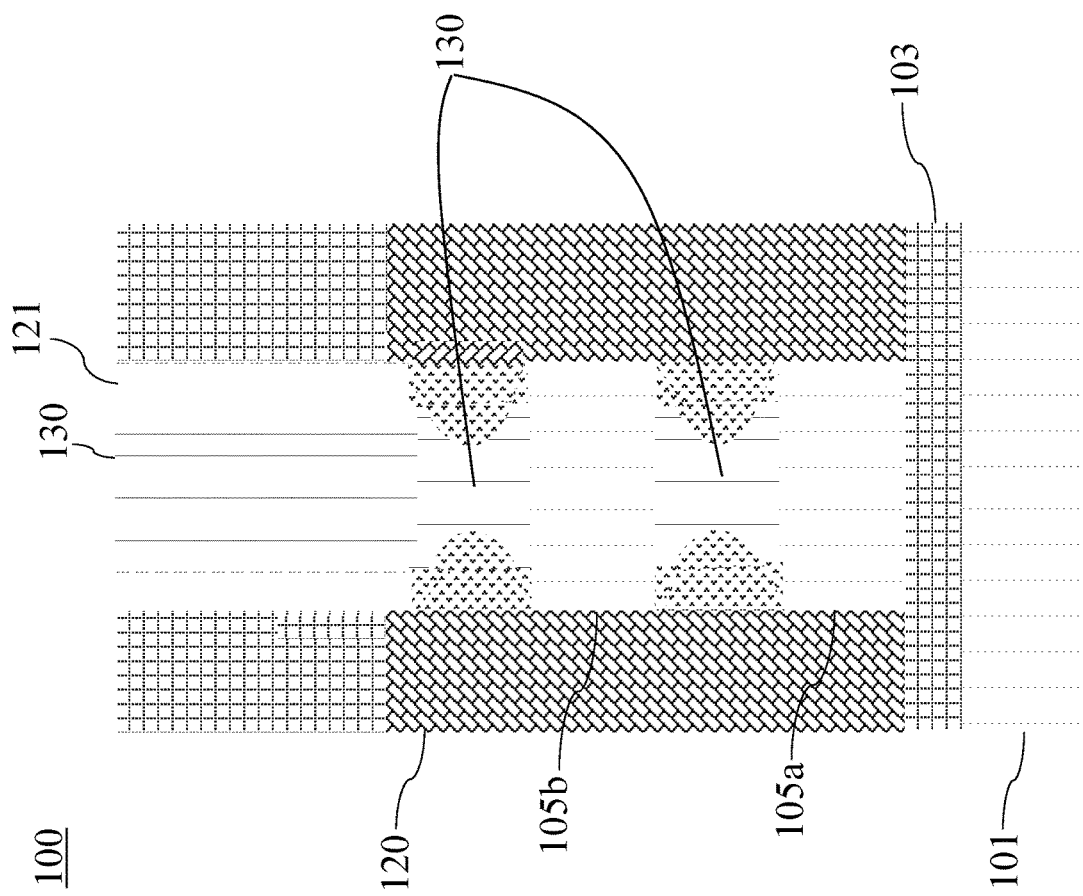
FIG. 13 is a schematic cross-sectional view illustrating gate formation on the FIG. 12 structure, according to an embodiment of the invention.

Referring to FIG. 13, the silicon layers 105a and 105b are suspended, and gate structures 130 including, for example, gate and dielectric portions, are formed in the vacant areas 125 and 127 in place of the removed dummy gate portion 110 and silicon germanium layers 107a and 107b. According to an embodiment, each gate structure 130 includes a gate dielectric layer such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum oxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate structures 130 each include a gate region including a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The gate regions can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer.

The inner spacers 123 remain on lateral sides of the gate structures 130 that replaced the silicon germanium layers 107a and 107b. The rectangular portions of respective ones of the inner spacers 123 are disposed adjacent the plurality of epitaxial source/drain regions 120. The elliptical portions of the respective ones of the inner spacers 123 are formed on curved surfaces of respective sides of their corresponding gate structures 130. The elliptical portion of a given one of the inner spacers 123 extends from the rectangular portion of the given one of the inner spacers 123 toward a lateral side of a corresponding gate structure 130. As noted above, each of the inner spacers 123 comprises a curved surface between an upper vertical linear (e.g., straight) surface and a lower vertical linear (e.g., straight) surface. Each combination of the curved surface and the vertical linear surfaces of the respective ones of the inner spacers 123 are disposed on a corresponding gate structure.

Similar to the remaining portions of the silicon germanium layers 107a and 107b discussed in connection with FIG. 8, at upper and lower parts of the rectangular portions of the inner spacers 123, respective vertical surfaces of the gate structures 130 are perpendicular or substantially perpendicular to top or bottom surfaces of underlying or overlying silicon layers 105a and 105b or of the spacers 121. As can be seen, respective sides of the gate structures 130 include a curved surface between a top linear (e.g., straight) vertical surface and a bottom linear (e.g., straight) vertical surface. A width of respective ones of the gate structures 130 is narrower at a middle portion than at upper and lower portions, and is formed in an hourglass shape.

For ease of explanation, one nanosheet/gate structure stack is shown in FIG. 13. However, the embodiments are not limited thereto, and more than one nanosheet/gate structure stack can be formed on a semiconductor substrate 101.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a plurality of gate structures alternately stacked with a plurality of channel layers; and
   a plurality of spacers disposed on lateral sides of the plurality of gate structures;
   wherein respective ones of the plurality of spacers comprise a profile having a first portion comprising a first shape and a second portion comprising a second shape, wherein the first shape is different from the second shape; and
   wherein a width of a gate structure of the plurality of gate structures is narrower at a first portion than at second and third portions of the gate structure.

2. The semiconductor structure of claim 1, wherein the first shape is rectangular and the second shape is elliptical.

3. The semiconductor structure of claim 2, further comprising a plurality of epitaxial source/drain regions extending from the plurality of channel layers, wherein first portions of the respective ones of the plurality of spacers are disposed adjacent the plurality of epitaxial source/drain regions.

4. The semiconductor structure of claim 3, wherein surfaces of the first portions of the respective ones of the plurality of spacers contact the plurality of epitaxial source/drain regions.

5. The semiconductor structure of claim 4, wherein the surfaces of the first portions of the respective ones of the plurality of spacers contacting the plurality of epitaxial source/drain regions are straight.

6. The semiconductor structure of claim 3, wherein lowermost surfaces of the plurality of epitaxial source/drain regions are on a top surface of a semiconductor substrate.

7. The semiconductor structure of claim 2, wherein respective sides of the plurality of gate structures comprise a curved surface.

8. The semiconductor structure of claim 7, wherein second portions of the respective ones of the plurality of spacers are formed on the curved surfaces of the respective sides of the plurality of gate structures.

9. The semiconductor structure of claim 2, wherein a second portion of a given one of the plurality of spacers extends from a first portion of the given one of the plurality of spacers toward a lateral side of the gate structure of the plurality of gate structures.

10. The semiconductor structure of claim 1, wherein the first portion comprises a middle portion of the gate structure and the second and third portions respectively comprise upper and lower portions of the gate structure.

11. The semiconductor structure of claim 1, wherein the respective ones of the plurality of spacers comprise a curved surface between a first straight surface and a second straight surface.

12. The semiconductor structure of claim 11, wherein:
the curved surface and the first and second straight surfaces of the respective ones of the plurality of spacers are disposed on respective gate structures of the plurality of gate structures.

13. A nanosheet structure, comprising:
a plurality of first semiconductor layers alternately stacked with a plurality of second semiconductor layers; and
a plurality of spacers disposed on lateral sides of first semiconductor layers;
wherein respective ones of the plurality of spacers comprise a profile having a first portion comprising a first shape and a second portion comprising a second shape extending from the first portion, wherein the first shape is different from the second shape;
wherein a width of a first semiconductor layer of the plurality of first semiconductor layers is narrower at a first portion than at second and third portions of the first semiconductor layer.

14. The nanosheet structure of claim 13, wherein the first shape is rectangular and the second shape is elliptical.

15. The nanosheet structure of claim 13, wherein the respective ones of the plurality of spacers comprise a curved surface between a top straight surface and a bottom straight surface.

16. The nanosheet structure of claim 15, wherein:
the curved surface and the top and bottom straight surfaces of the respective ones of the plurality of spacers are disposed on respective first semiconductor layers of the plurality of first semiconductor layers.

17. The nanosheet structure of claim 13, wherein the first portion comprises a middle portion of the first semiconductor layer and the second and third portions respectively comprise upper and lower portions of the first semiconductor layer.

18. The nanosheet structure of claim 13, wherein respective sides of the plurality of first semiconductor layers comprise a curved surface.

19. The nanosheet structure of claim 18, wherein second portions of the respective ones of the plurality of spacers are formed on the curved surfaces of the respective sides of the plurality of first semiconductor layers.

20. The nanosheet structure of claim 13, wherein a second portion of a given one of the plurality of spacers extends from a first portion of the given one of the plurality of spacers toward a lateral side of the first semiconductor layer of the plurality of first semiconductor layers.

* * * * *